(12) United States Patent
Choi (10) Patent No.: US 8,649,237 B2
(45) Date of Patent: Feb. 11, 2014

(54) POWER-UP SIGNAL GENERATION CIRCUIT (75) Inventor: Young Geun Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 13/483,692

(22) Filed: May 30, 2012

(65) Prior Publication Data
US 2013/0176806 A1 Jul. 11, 2013

(30) Foreign Application Priority Data

Jan. 5, 2012 (KR) ........................ 10-2012-0001716

(51) Int. Cl.
G11C 5/14 (2006.01)
(52) U.S. Cl.
USPC ................. 365/226; 365/189.08; 365/189.09; 365/191; 327/143; 307/130
(58) Field of Classification Search
USPC ........ 365/226, 189.08, 189.09, 191; 327/143; 307/130
See application file for complete search history.

(56) References Cited

U.S. PATENT DOCUMENTS 7,388,414 B1 * 6/2008 Pasqualini .................... 327/143
2004/0012267 A1 * 1/2004 Kang ............................ 307/130

FOREIGN PATENT DOCUMENTS

KR 101062778 B1 8/2011

* cited by examiner

Primary Examiner — Fernando Hidalgo
(74) Attorney, Agent, or Firm — William Park & Associates Patent Ltd.

(57) ABSTRACT

A power-up signal generation circuit includes a first driving section configured to generate a pre-power-up signal by driving a first node to a first pull-up drivability or driving the first node to a first pull-down drivability in response to an internal voltage when not in an active mode, and a second driving section configured to generate the pre-power-up signal by driving the first node to a second pull-up drivability or driving the first node to a second pull-down drivability in response to the internal voltage in the active mode. The first pull-up drivability is larger than the second pull-up drivability, and the first pull-down drivability is smaller than the second pull-down drivability.

20 Claims, 6 Drawing Sheets

FIG. 1

(PRIOR ART)

FIG. 2

(PRIOR ART)

POWER-UP SIGNAL GENERATION CIRCUIT

CROSS-REFERENCES TO RELATED APPLICATIONS

The present application claims priority under 35 U.S.C 119(a) to Korean Application No. 10-2012-0001716, filed on Jan. 5, 2012, in the Korean intellectual property Office, which is incorporated herein by reference in its entirety as set forth in full.

BACKGROUND

1. Field of the Invention

Example embodiments relate to a semiconductor memory device, and more particularly a semiconductor memory device configured to control a power-up signal according to an internal voltage and an active mode.

2. Description of the Related Art

In general, a power-up signal generation circuit in a semiconductor memory device refers to a circuit serving to reset the semiconductor memory device. Typically, a power supply voltage VDD is supplied from outside to operate the semiconductor memory device. The voltage level of the power supply voltage VDD starts from 0V and increases to a target voltage level with a constant slope. When directly receiving such a power supply voltage VDD, all circuits of the semiconductor memory device may malfunction due to the effect of the increasing power supply voltage. Therefore, in order to prevent such a malfunction, the semiconductor memory device includes a power-up signal generation circuit which changes the level of a power-up signal such that the external voltage VDD is supplied to respective circuits after the power-up signal is changed to a stable voltage level. Here, the power-up signal is a signal having a level that increases during a power-up period according to the level of the power supply voltage VDD, and the power-up signal level transits to a logic low level after the power-up period. During the power-up period, the level of the power supply voltage VDD supplied to the semiconductor memory device approaches a preset level (hereafter, referred to as a target level).

Figure 1:
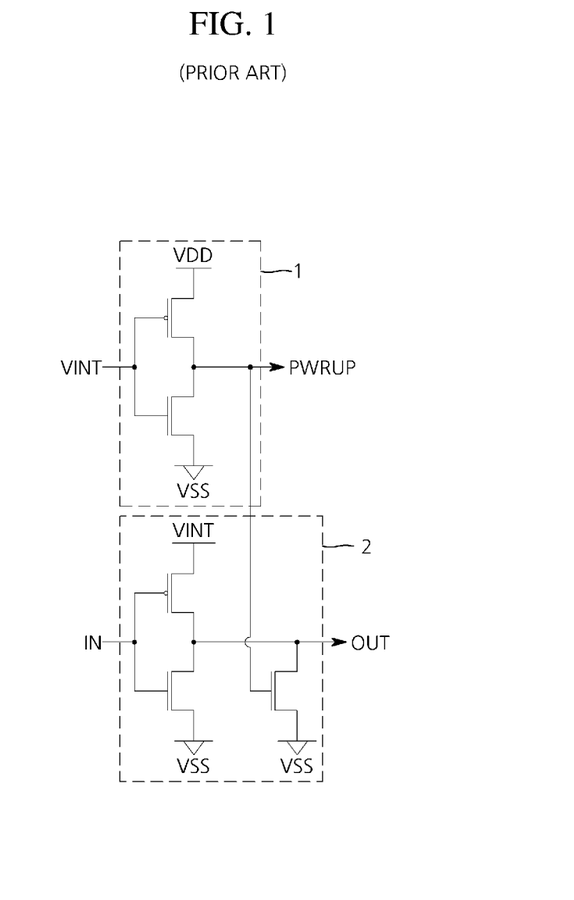
FIG. 1 is a circuit diagram illustrating a configuration of a conventional semiconductor memory device.

FIG. 1 is a circuit diagram illustrating the configuration of a conventional semiconductor memory device.

Referring to FIG. 1, the conventional memory device includes a power-up signal generation circuit 1 and an internal circuit 2. The power-up signal generation circuit 1 is configured to generate a power-up signal PWRUP having a level that increases according to the level of an internal voltage VINT, which increases from 0V with a constant slope like a power supply voltage VDD, and then transits to a logic low level after a power-up period is completed. The internal circuit 2 is configured to receive the internal voltage VINT after the power-up period and buffer an input signal IN to generate an output signal OUT. Furthermore, the internal circuit 2 receives the power-up signal PWRUP and couples the output signal OUT to a ground voltage VSS to perform a reset operation in the power-up period.

Figure 2:
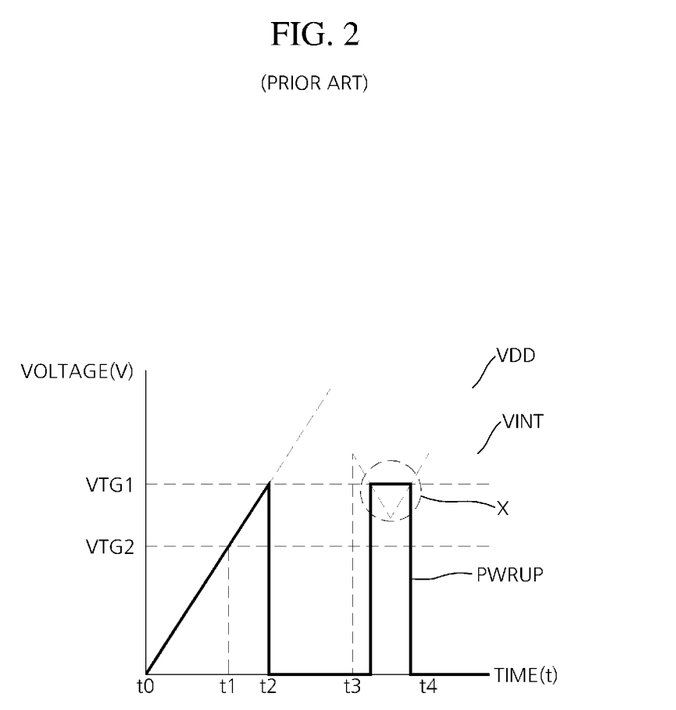
FIG. 2 is a diagram illustrating the level of a power-up signal which is generated according to the level of a target voltage in a power-up signal generation circuit of FIG. 1.

Referring to FIG. 2, the operation of the semiconductor memory device configured in such a manner will be described as follows.

FIG. 2 is a diagram illustrating the level of a power-up signal which is generated according to the level of a target voltage in the power-up signal generation circuit of FIG. 1.

Referring to FIG. 2, when the target voltage is set at a high value VTG1 to stably reset the internal circuit 2 of the semiconductor memory device, the level of the internal voltage VINT decreases in cases where the current consumption of the semiconductor memory device increases in a period t3~t4 after a power-up period t0~t2. At this time, a period X in which the level of the internal voltage VINT becomes lower than the target voltage VTG1 may occur. In this case, a repower-up occurs to change the power-up signal PWRUP to a logic high level. That is, the output signal OUT of the internal circuit 2 is reset according to the power-up signal PWRUP which is generated at a logic high level in the period X, and causes an operation error of the semiconductor memory device. When the target voltage is set at a low value VTG2 to prevent such a repower-up, the power-up signal PWRUP is generated at a low level in the power-up period t0~t1. Therefore, since the output signal OUT of the internal circuit 2 is not reset, a reset operation error of the semiconductor memory device may occur.

SUMMARY

An embodiment of the present invention relates to a power-up signal generation circuit capable of substantially preventing a repower-up by controlling drivability for driving a power-up signal according to an operation mode of a semiconductor memory device.

In one embodiment, a power-up signal generation circuit includes: a first driving section configured to generate a pre-power-up signal by driving a first node to a first pull-up drivability or driving the first node to a first pull-down drivability in response to an internal voltage when not in an active mode; and a second driving section configured to generate the pre-power-up signal by driving the first node to a second pull-up drivability or driving the first node to a second pull-down drivability in response to the internal voltage in the active mode. The first pull-up drivability is larger than the second pull-up drivability, and the first pull-down drivability is smaller than the second pull-down drivability.

In another embodiment, a power-up signal generation circuit includes: a driving select signal generation unit configured to generate a driving select signal having a first level in an active mode and having a second level when not in the active mode, in response to a plurality of bank active signals; and a power-up signal generation unit configured to generate a power-up signal by pull-up driving a first node to a first pull-up drivability or pull-down driving the first node to a first pull-down drivability according to a level of an internal voltage when the driving select signal is at the second level, and generate the power-up signal by pull-up driving the first node to a second pull-up drivability or pull-down driving the first node to a second pull-down drivability according to the level of the internal voltage when the driving select signal is at the first level, in response to the driving select signal. The first pull-up drivability is larger than the second pull-up drivability, and the first pull-down drivability is smaller than the second pull-down drivability.

In still another embodiment, a method of controlling a power-up signal of a semiconductor memory device includes generating a pre-power-up signal by driving a first node to a first pull-up or first pull-down drivability according to an internal voltage when the semiconductor memory device is not in an active mode; generating the pre-power-up signal by driving the first node to a second pull-up drivability or a second pull-down drivability according to the internal voltage when the semiconductor memory device is in the active mode, wherein the first pull-up drivability is larger than the second pull-up drivability, and the first pull-down drivability is smaller than the second pull-down drivability, and generating the power-up signal according to the pre-power-up signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 3:
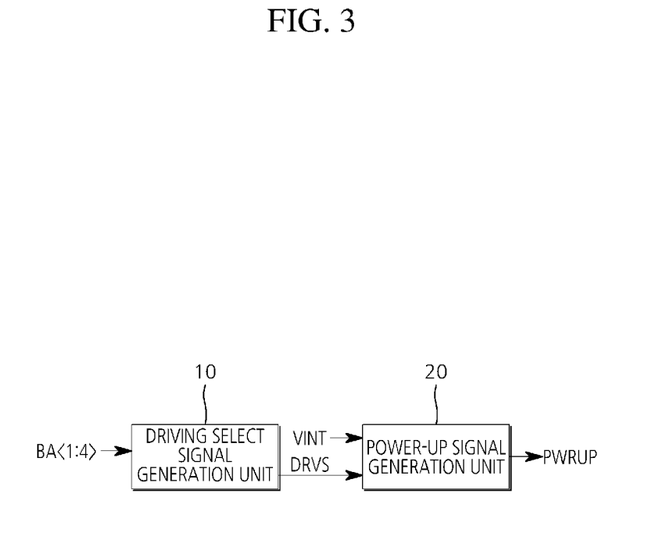
FIG. 3 is a block diagram illustrating a configuration of a power-up signal generation circuit in accordance with an embodiment of the present invention.

FIG. 3 is a block diagram illustrating a configuration of a power-up signal generation circuit in accordance with an embodiment of the present invention.

Referring to FIG. 3, the power-up signal generation circuit includes a driving select signal generation unit 10 and a power-up signal generation unit 20. The driving select signal generation unit 10 is configured to receive first to fourth bank active signals BA<1:4> and generate a driving select signal DRVS which is enabled to a logic low level in an active mode. When the driving select signal DRVS is at a logic high level, the power-up signal generation unit 20 is configured to generate a power-up signal PWRUP signal according to the level of an internal voltage VINT by pull-up driving a first node nd20 to a first pull-up drivability or by pull-down driving the first node nd20 to a first pull-down drivability. When the driving select signal DRVS is at a logic low level, the power-up signal generation unit 20 is configured to generate the power-up signal PWRUP according to the level of an internal voltage VINT by pull-up driving the first node nd20 to a second pull-up drivability or pull-down driving the first node nd20 to a second pull-down drivability.

A configuration of the driving select signal generation unit 10 will be described in more detail with reference to FIG. 4.

Figure 4:
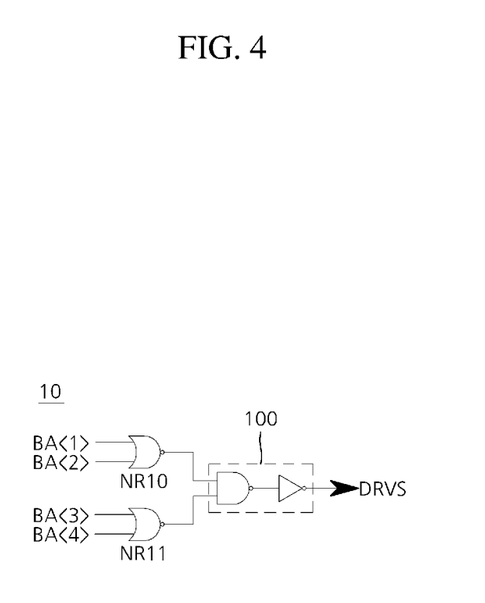
FIG. 4 is a circuit diagram of a driving select signal generation unit included in the power-up signal generation circuit of FIG. 3.

Referring to FIG. 4, the driving select signal generation unit 10 includes a first logic element NR10, a second logic element NR11, and a logic section 100. The first logic element NR10 is configured to perform a NOR operation on the first and second bank active signals BA<1:2>, and the second logic element NR11 is configured to perform a NOR operation on the third and fourth bank active signals BA<3:4>. The logic section 100 is configured to perform a NAND operation on an output signal of the first logic element NR10 and an output signal of the second logic element NR11 and generate the driving select signal DRVS. Here, the first to fourth bank active signals BA<1:4> are enabled to a logic high level when the semiconductor memory device enters the active mode to select a bank including a plurality of memory cells. That is, the driving select signal generation unit 10 generates the driving select signal DRVS, which is enabled to a logic low level, when the semiconductor memory device enters the active mode to enable one or more of the first to fourth bank active signals BA<1:4> to a logic high level.

The configuration of the power-up signal generation unit 20 will be described in more detail with reference to FIG. 5.

Figure 5:
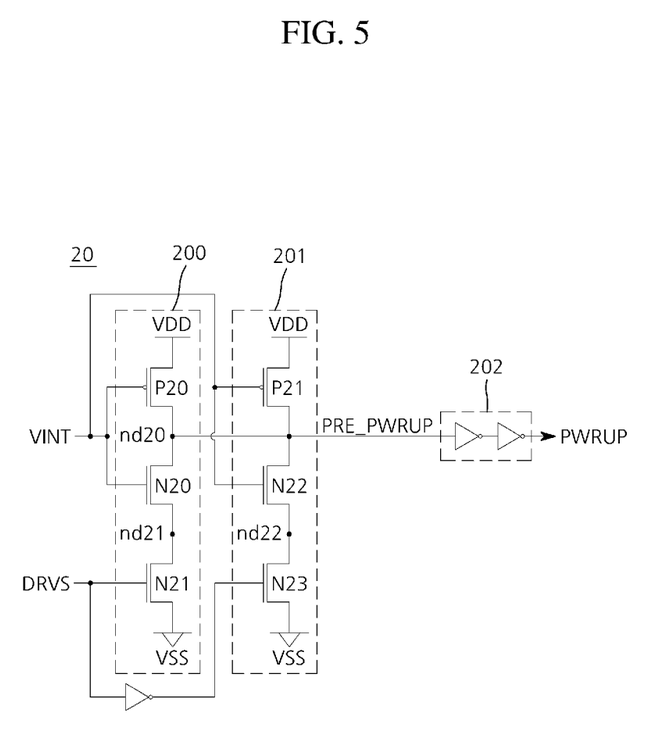
FIG. 5 is a circuit diagram of a power-up signal generation unit included in the power-up signal generation circuit of FIG. 3.

Referring to FIG. 5, the power-up signal generation unit 20 includes a first driving section 200, a second driving section 201, and a delay section 202. When the semiconductor memory device is not in the active mode, the first driving section 200 is configured to generate a pre-power-up signal PRE_PWRUP by pull-up driving the first node nd20 to the first pull-up drivability or pull-down driving the first node nd20 to the first pull-down drivability according to and/or in response to the level of the internal voltage VINT. When the semiconductor memory device is in the active mode, the second driving section 201 is configured to generate the pre-power-up signal PRE_PWRUP by pull-up driving the first node nd20 to the second pull-up drivability or pull-down driving the first node nd20 to the second pull-down drivability according to and/or in response to the level of the internal voltage VINT. The delay section 202 is configured to buffer the pre-power-up signal PRE_PWRUP and generate a power-up signal PWRUP according to the pre-power-up signal PRE_PWRUP. Here, the first pull-up drivability is larger than the second pull-up drivability, and the first pull-down drivability is smaller than the second pull-down drivability.

The first driving section 200 includes a first pull-up element P20, a first pull-down element N20, and a first driving element N21. The first pull-up element P20 is positioned between a power supply voltage VDD and the first node nd20 and configured to receive the internal voltage VINT and pull-up drive the first node nd20 to the first pull-up drivability. The first pull-down element N20 is positioned between the first node nd20 and a second node nd21 and configured to receive the internal voltage VINT and pull-down drive the first node nd20 to the first pull-down drivability. The first driving element N21 is positioned between the second node nd21 and a ground voltage VSS and configured to receive the driving select signal DRVS and pull-down drive the second node nd21. The first driving section 200 receives the driving select signal DRVS which is disabled to a logic high level when the semiconductor memory device is not in the active mode, and the first driving section 200 increases the level of the pre-power-up signal PRE_PWRUP by pull-up driving the first node nd20 to the first pull-up drivability in a power-up period. Furthermore, the first driving section 200 pull-down drives the first node nd20 to the first pull-down drivability after the power-up period when the semiconductor memory device is not in the active mode, and generates the pre-power-up signal PRE_PWRUP which transits from a logic high level to a logic low level.

The second driving section 201 includes a second pull-up element P21, a second pull-down element N22, and a second driving element N23. The second pull-up element P21 is positioned between the power supply voltage VDD and the first node nd20 and configured to receive the internal voltage VINT and pull-up drive the first node nd20 to the second pull-up drivability. The second pull-down element N22 is positioned between the first node nd20 and a third node nd22 and configured to receive the internal voltage VINT and pull-down drive the first node nd20 to the second pull-down drivability. The second driving element N23 is positioned between the third node nd22 and the ground voltage VSS and configured to receive the driving select signal DRVS and pull-down drive the third node nd22. The second driving section 201 generates the pre-power-up signal PRE_PWRUP by pull-down driving the first node nd20 to the second pull-down drivability when the semiconductor memory device is in the active mode, after the power-up period. The threshold voltage of the first pull-up element P20 may be set to a lower level than the threshold voltage of the second pull-up element P21 such that the drivability of the first pull-up element P20 is larger than the drivability of the second pull-up element P21. The threshold voltage of the first pull-down element N20 may be set to a higher level than the threshold voltage of the second pull-down element N22 such that the drivability of the first pull-down element N20 is smaller than the drivability of the second pull-down element N22. Furthermore, when the first driving section 200 is driven, the level of the target voltage to which the pre-power-up signal PRE_PWRUP transits is set lower than when the second driving section 201 is driven.

The delay section 202 buffers the pre-power-up signal PRE_PWRUP and generates the power-up signal PWRUP.

Figure 6:
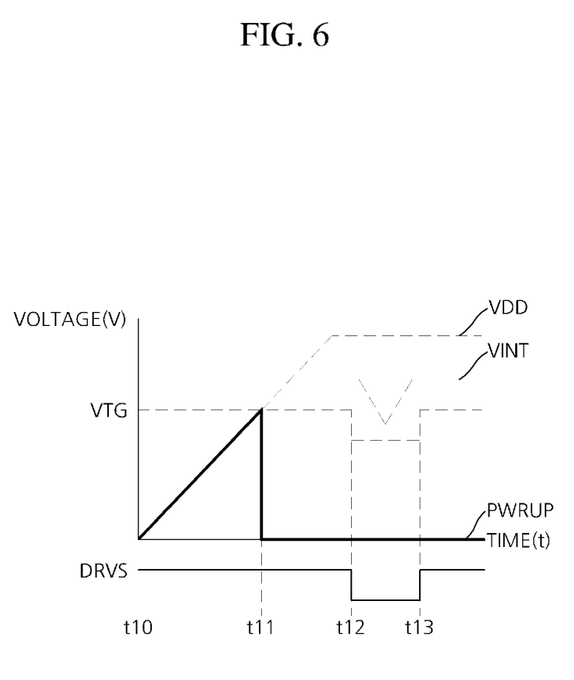
FIG. 6 is a diagram illustrating the level of a power-up signal which is generated by controlling drivability according to an operation mode of a semiconductor memory device in accordance with an embodiment of the present invention.

Operation of the above-described power-up signal generation circuit will be described with reference to FIG. 6. In the following descriptions, a case in which the semiconductor memory device operates in the power-up period, a case in which the semiconductor memory device is not in the active mode after the power-up period, and a case in which the semiconductor memory device operates in the active mode after the power-up period will be used as examples.

When the semiconductor memory device enters the power-up period, the driving select signal generation unit 10 receives the first to fourth bank active signals BA<1:4> disabled to a logic low level, and generates the driving select signal DRVS disabled to a logic high level in a period t10~t11.

The first driving section 200 is driven by receiving the driving select signal DRVS which maintains a logic high level in the period t10~t11 corresponding to the power-up period. When the level of the internal voltage VINT increases from 0V in the period t10~t11, the first pull-up element P20 of the first driving section 200 is turned on, and the first pull-down element N20 is turned off. Then, the level of the first node nd20 increases according to the level of the power supply voltage VDD. Furthermore, when the level of the internal voltage VINT increases to approach the level of the target voltage VTG at the time point t11, the first pull-up element P20 of the first driving section 200 is turned off, and the first pull-down element N20 is turned on. Then, the first node nd20 transits to a logic low level. Therefore, the power-up signal PWRUP generated by the power-up signal generation unit 20 increases according to the level of the power supply voltage VDD during the period t10~t11, and transits to a logic low level at the time point t11.

When the semiconductor memory device is not in the active mode after the power-up period t10~t11, the driving select signal generation unit 10 receives the first to fourth bank active signals BA<1:4> disabled to a logic low level, and generates the driving select signal DRVS disabled to a logic high level in a period t11~t12. The first driving section 200 of the power-up signal generation unit 20 is driven by receiving the driving select signal DRVS which is at a logic high level in the period t11~t12. According to the internal voltage VINT having a higher level than the target voltage VTG in the period t11~t12, the first pull-up element P20 of the first driving section 200 is turned off, and the first pull-down element N20 is turned on. Then, the first node nd20 is driven to a logic low level. Therefore, the power-up signal PWRUP generated by the power-up signal generation unit 20 is generated at a logic low level in the period t11~t12.

When the semiconductor memory device enters the active mode, the driving select signal generation unit 10 receives the first to fourth bank active signals BA<1:4> of which one or more are enabled to a logic high level, and generates the driving select signal DRVS enabled to a logic low level in a period t12~t13. The second driving section 201 of the power-up signal generation unit 20 is driven by receiving an inverted signal of the driving select signal DRVS which is at a logic low level in the period t12~t13. According to the internal voltage VINT having a higher level than the target voltage VTG in the period t12~t13, the second pull-up element P21 of the second driving section 201 is turned off, and the second pull-down element N22 is turned on. Then, the first node nd20 is driven to a logic low level. At this time, when the semiconductor memory device enters the active mode such that the current consumption increases, the level of the internal voltage VINT decreases. However, since the level of the target voltage VTG is set to a low level when the second driving section 201 is driven, the first node nd20 does not transit to a logic high level even though the level of the internal voltage VINT decreases. Therefore, the power-up signal PWRUP generated by the power-up signal generation unit 20 is generated at a logic low level in the period t12~t13.

In accordance with an embodiment of the present invention, the power-up signal generation circuit pull-down drives the power-up signal PWRUP to the second pull-down drivability having a larger value when the semiconductor memory device enters the active mode. Therefore, the target voltage is set to a low level. Accordingly, even when the level of the internal voltage VINT decreases in the active mode, a repower-up does not occur, which makes it possible to substantially prevent an operation error of the semiconductor memory device.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A power-up signal generation circuit comprising:
   a first driving section configured to generate a pre-power-up signal by driving a first node to a first pull-up drivability or driving the first node to a first pull-down drivability in response to an internal voltage when not in an active mode; and
   a second driving section configured to generate the pre-power-up signal by driving the first node to a second pull-up drivability or driving the first node to a second pull-down drivability in response to the internal voltage in the active mode,
   wherein the first pull-up drivability is larger than the second pull-up drivability, and the first pull-down drivability is smaller than the second pull-down drivability.

2. The power-up signal generation circuit of claim 1, wherein the first driving section comprises:
   a first pull-up element positioned between a power supply voltage and the first node and configured to pull-up drive the first node to the first pull-up drivability in response to the internal voltage;
   a first pull-down element positioned between the first node and a second node and configured to pull-down drive the first node to the first pull-down drivability in response to the internal voltage; and a first driving element positioned between the second node and a ground voltage and configured to pull-down drive the second node in response to a driving select signal enabled in the active mode.

3. The power-up signal generation circuit of claim 2, wherein the second driving section comprises:
   a second pull-up element positioned between the power supply voltage and the first node and configured to pull-up drive the first node to the second pull-up drivability in response to the internal voltage;
   a second pull-down element positioned between the first node and a third node and configured to pull-down drive the first node to the second pull-down drivability in response to the internal voltage; and
   a second driving element positioned between the third node and the ground voltage and configured to pull-down drive the third node in response to the driving select signal.

4. The power-up signal generation circuit of claim 3, wherein a threshold voltage of the first pull-up element has a lower level than that of the second pull-up element.

5. The power-up signal generation circuit of claim 3, wherein a threshold voltage of the first pull-down element has a higher level than that of the second pull-down element.

6. The power-up signal generation circuit of claim 1, further comprising a delay section configured to buffer the pre-power-up signal and generate a power-up signal.

7. A power-up signal generation circuit comprising:
   a driving select signal generation unit configured to generate a driving select signal having a first level in an active mode and having a second level when not in the active mode, in response to a plurality of bank active signals; and
   a power-up signal generation unit configured to generate a power-up signal by pull-up driving a first node to a first pull-up drivability or pull-down driving the first node to a first pull-down drivability according to a level of an internal voltage when the driving select signal is at the second level, and generate the power-up signal by pull-up driving the first node to a second pull-up drivability or pull-down driving the first node to a second pull-down drivability according to the level of the internal voltage when the driving select signal is at the first level, in response to the driving select signal,
   wherein the first pull-up drivability is larger than the second pull-up drivability, and the first pull-down drivability is smaller than the second pull-down drivability.

8. The power-up signal generation circuit of claim 7, wherein the driving select signal comprises a signal which is generated at the first level when one or more of the plurality of bank active signals are enabled.

9. The power-up signal generation circuit of claim 7, wherein the power-up signal generation unit comprises:
   a first driving section configured to generate a pre-power-up signal by pull-up driving the first node to the first pull-up drivability or pull-down driving the first node to the first pull-down drivability in response to the internal voltage when the driving select signal is at the second level; and
   a second driving section configured to generate the pre-power-up signal by pull-up driving the first node to the second pull-up drivability or pull-down driving the first node to the second pull-down drivability in response to the internal voltage when the driving select signal is at the first level.

10. The power-up signal generation circuit of claim 9, wherein the first driving section comprises:
    a first pull-up element positioned between a power supply voltage and the first node and configured to pull-up drive the first node to the first pull-up drivability in response to the internal voltage;
    a first pull-down element positioned between the first node and a second node and configured to pull-down drive the first node to the first pull-down drivability in response to the internal voltage; and
    a first driving element positioned between the second node and a ground voltage and configured to pull-down drive the second node in response to the driving select signal.

11. The power-up signal generation circuit of claim 10, wherein the second driving section comprises:
    a second pull-up element positioned between the power supply voltage and the first node and configured to pull-up drive the first node to the second pull-up drivability in response to the internal voltage;
    a second pull-down element positioned between the first node and a third node and configured to pull-down drive the first node to the second pull-down drivability in response to the internal voltage; and
    a second driving element positioned between the third node and the ground voltage and configured to pull-down drive the third node in response to the driving select signal.

12. The power-up signal generation circuit of claim 11, wherein a threshold voltage of the first pull-up element has a lower level than that of the second pull-up element.

13. The power-up signal generation circuit of claim 11, wherein a threshold voltage of the first pull-down element has a higher level than that of the second pull-down element.

14. The power-up signal generation circuit of claim 9, wherein the power-up signal generation unit further comprises a delay section configured to buffer the pre-power-up signal and generate a power-up signal.

15. A method of controlling a power-up signal of a semiconductor memory device, comprising:
    generating a pre-power-up signal by driving a first node to a first pull-up drivability or a first pull-down drivability according to an internal voltage when the semiconductor memory device is not in an active mode;
    generating the pre-power-up signal by driving the first node to a second pull-up drivability or a second pull-down drivability according to the internal voltage when the semiconductor memory device is in the active mode; and
    generating the power-up signal according to the pre-power-up signal,
    wherein the first pull-up drivability is larger than the second pull-up drivability, and the first pull-down drivability is smaller than the second pull-down drivability.

16. The method of claim 15, wherein a first driving section is configured to generate the pre-power-up signal by driving the first node to the first pull-up drivability or the first pull-down drivability according to the internal voltage when the semiconductor memory device is not in the active mode, and a second driving section is configured to generate the pre-power-up signal by driving the first node to the second pull-up drivability or the second pull-down drivability according to the internal voltage when the semiconductor memory device is in the active mode.

17. The method of claim 16, wherein the first driving section comprises:
    a first pull-up element positioned between a power supply voltage and the first node and configured to pull-up drive the first node to the first pull-up drivability according to the internal voltage;

a first pull-down element positioned between the first node and a second node and configured to pull-down drive the first node to the first pull-down drivability according to the internal voltage; and a first driving element positioned between the second node and a ground voltage and configured to pull-down drive the second node in response to a driving select signal.

18. The method of claim 17, wherein the second driving section comprises:

a second pull-up element positioned between the power supply voltage and the first node and configured to pull-up drive the first node to the second pull-up drivability in response to the internal voltage;

a second pull-down element positioned between the first node and a third node and configured to pull-down drive the first node to the second pull-down drivability in response to the internal voltage; and a second driving element positioned between the third node and the ground voltage and configured to pull-down drive the third node in response to the driving select signal.

19. The method of claim 18, wherein a threshold voltage of the first pull-up element has a lower level than that of the second pull-up element, and a threshold voltage of the first pull-down element has a higher level than that of the second pull-down element.

20. The method of claim 15, further comprising;

buffering, at a delay section, the pre-power-up signal; and generating, at the delay section, the power-up signal.

* * * * *